(12) United States Patent
Pickering et al.

(10) Patent No.: US 7,423,469 B2
(45) Date of Patent: Sep. 9, 2008

(54) TRIANGULATING PHASE INTERPOLATOR

(75) Inventors: Andrew Pickering, Rugby (GB);
Bhajan Singh, Birmingham (GB);
Susan Simpson, Buckingham (GB)

(73) Assignee: Texas Instruments Incorporated,
Dallas, TX (US)

( * ) Notice: Subject to any disclaimer, the term of this patent is extended or adjusted under 35 U.S.C. 154(b) by 0 days.

(21) Appl. No.: 11/150,902

(22) Filed: Jun. 13, 2005

(65) Prior Publication Data
US 2006/0055430 A1 Mar. 16, 2006

(30) Foreign Application Priority Data
Jun. 12, 2004 (GB) ................. 0413071.2

(51) Int. Cl.
*H03K 3/00* (2006.01)
(52) U.S. Cl. .................. 327/231; 327/256; 327/257
(58) Field of Classification Search ............... 327/141, 327/266, 247, 246, 274
See application file for complete search history.

(56) References Cited

U.S. PATENT DOCUMENTS

| | | | |
|---|---|---|---|
| 5,396,523 A | 3/1995 | Hedberg | |
| 5,418,498 A * | 5/1995 | DeVito et al. | 331/57 |
| 5,808,498 A | 9/1998 | Donnelly | |
| 6,002,279 A * | 12/1999 | Evans et al. | 327/144 |
| 6,111,445 A | 8/2000 | Zerbe et al. | |
| 6,133,773 A * | 10/2000 | Garlepp et al. | 327/247 |
| 6,242,965 B1 | 6/2001 | Pickering et al. | 327/359 |
| 6,247,138 B1 | 6/2001 | Tamura et al. | |
| 2002/0036532 A1 * | 3/2002 | Chen | 327/246 |
| 2003/0002596 A1 * | 1/2003 | Dunning et al. | 375/316 |
| 2003/0123589 A1 | 7/2003 | Glenn | |
| 2004/0041604 A1 | 3/2004 | Kizer | |
| 2004/0052323 A1 * | 3/2004 | Zhang | 375/375 |
| 2005/0147194 A1 * | 7/2005 | Koenenkamp | 375/348 |
| 2006/0029172 A1 | 2/2006 | Andreotti | |

(Continued)

FOREIGN PATENT DOCUMENTS

EP    1 104 110 A2    5/2001

(Continued)

*Primary Examiner*—Dinh T. Le
(74) *Attorney, Agent, or Firm*—William B. Kempler; W. James Brady, III; Frederick J. Telecky, Jr.

(57) ABSTRACT

There is provided a clock phase interpolator comprising a pair of output nodes, at least three complementary clock signal inputs, an equal plurality of current sources, and an equal plurality of clock switching sections. Each clock switching section is connected to switch, under the control of a complementary clock signal on a respective one of the complementary clock signal inputs, the current provided by a respective one of the current sources between the two output nodes. The current sources are controllable to provide interpolation between signals on the complementary clock signal inputs. Also provided is a clock phase interpolator comprising a pair of output nodes, two complementary clock signal inputs, an equal plurality of current sources, an equal plurality of clock switching sections. Each clock switching section is connected to switch, under the control of a complementary clock signal on a respective one of the complementary clock signal inputs, the current provided by a respective one of the current sources between the two output nodes. The current sources are controllable to provide interpolation between signals on the complementary clock signal inputs, and each load comprises an integrator.

7 Claims, 5 Drawing Sheets

U.S. PATENT DOCUMENTS

2006/0091925 A1 * 5/2006 Desai et al. .................. 327/246

FOREIGN PATENT DOCUMENTS

| EP | 1104110 | A2 | 5/2001 |
|---|---|---|---|
| EP | 1 333 611 | A2 | 8/2003 |
| EP | 351 398 | A1 | 10/2003 |
| EP | 1351429 | A1 | 10/2003 |

* cited by examiner

CURRENT WAVEFORMS

VOLTAGE WAVEFORMS

TRIANGULATING PHASE INTERPOLATOR

BACKGROUND OF THE INVENTION

The present invention relates to phase interpolators, and more particularly, to triangulating phase interpolators.

FIG. 1 is a schematic block diagram of a phase interpolator which suffers from several disadvantages, including the following:
- the symmetric PMOS loads used are vulnerable to M/S ratio errors and differential offsets;
- injection of switching noise directly into differential amplifiers;
- reduction of headroom by current source/switch device stack;
- use of input clock multiplexers creates further potential switching noise problems.

In addition when using conventional phase interpolation techniques there is a degradation of linearity when the separation of the reference clock phases is increased from 45° to 90°, thereby limiting the use of the FIG. 1 phase interpolator.

There is a need for an improved phase interpolator which can mitigate the described disadvantages.

SUMMARY OF THE INVENTION

The present invention provides an improved phase interpolator which operates with CMOS-level reference clocks, i.e. square reference clock inputs, adopts a four-quadrant interpolation architecture, has a high impedance load, uses separate control loops to set common mode voltage in order to counteract the effects of M/S errors and uses current mirrors so that a current steering control circuit can be used to improve circuit headroom and filter noise from current switches.

Specific embodiments of the invention will now be described, by way of example only, with reference to the accompanying drawings, in which:

DETAILED DESCRIPTION OF SPECIFIC EMBODIMENTS OF THE INVENTION

Figure 1:
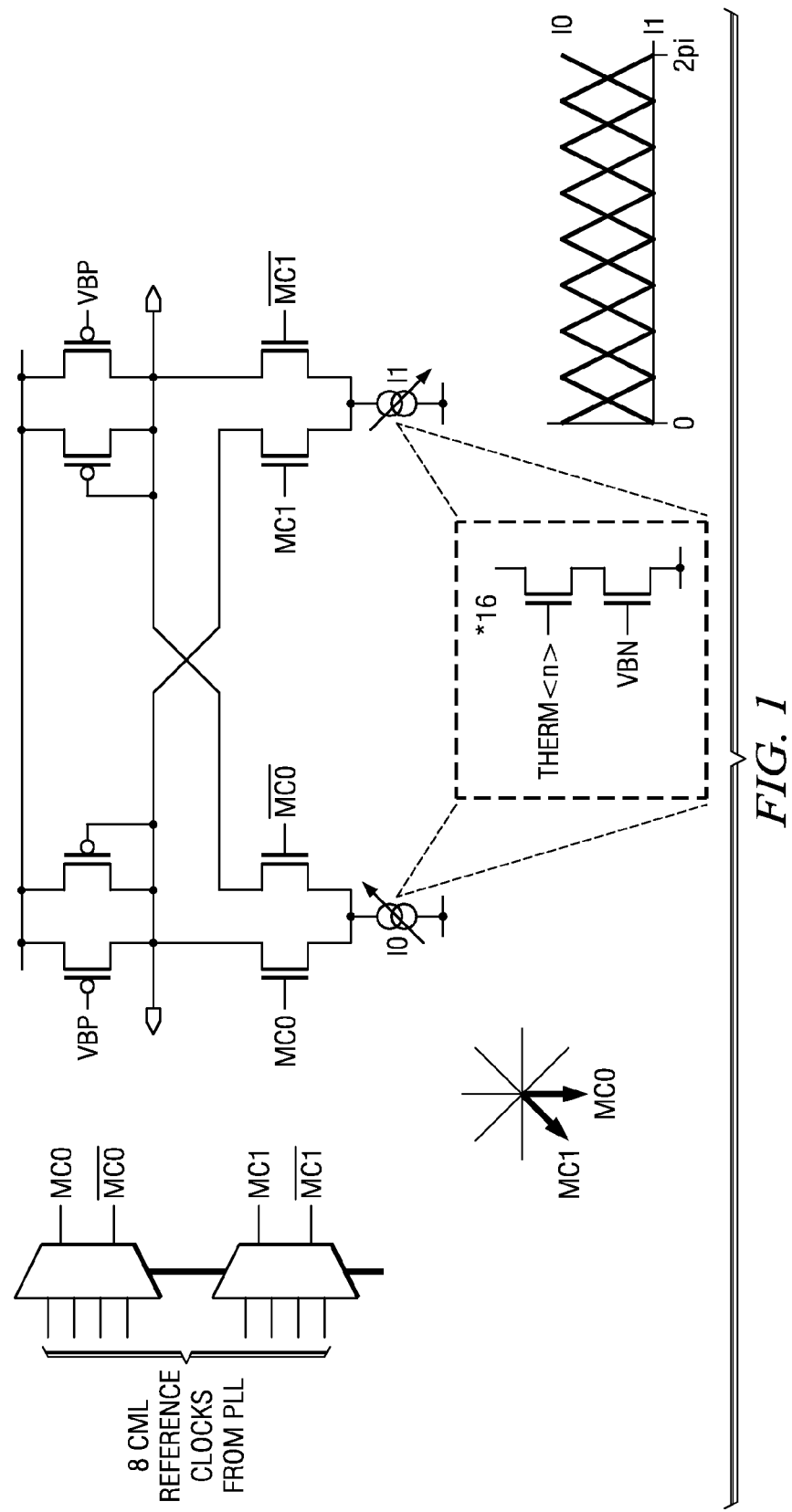
FIG. 1 is a schematic block diagram of a phase interpolator which suffers from several disadvantages.
Figure 2:
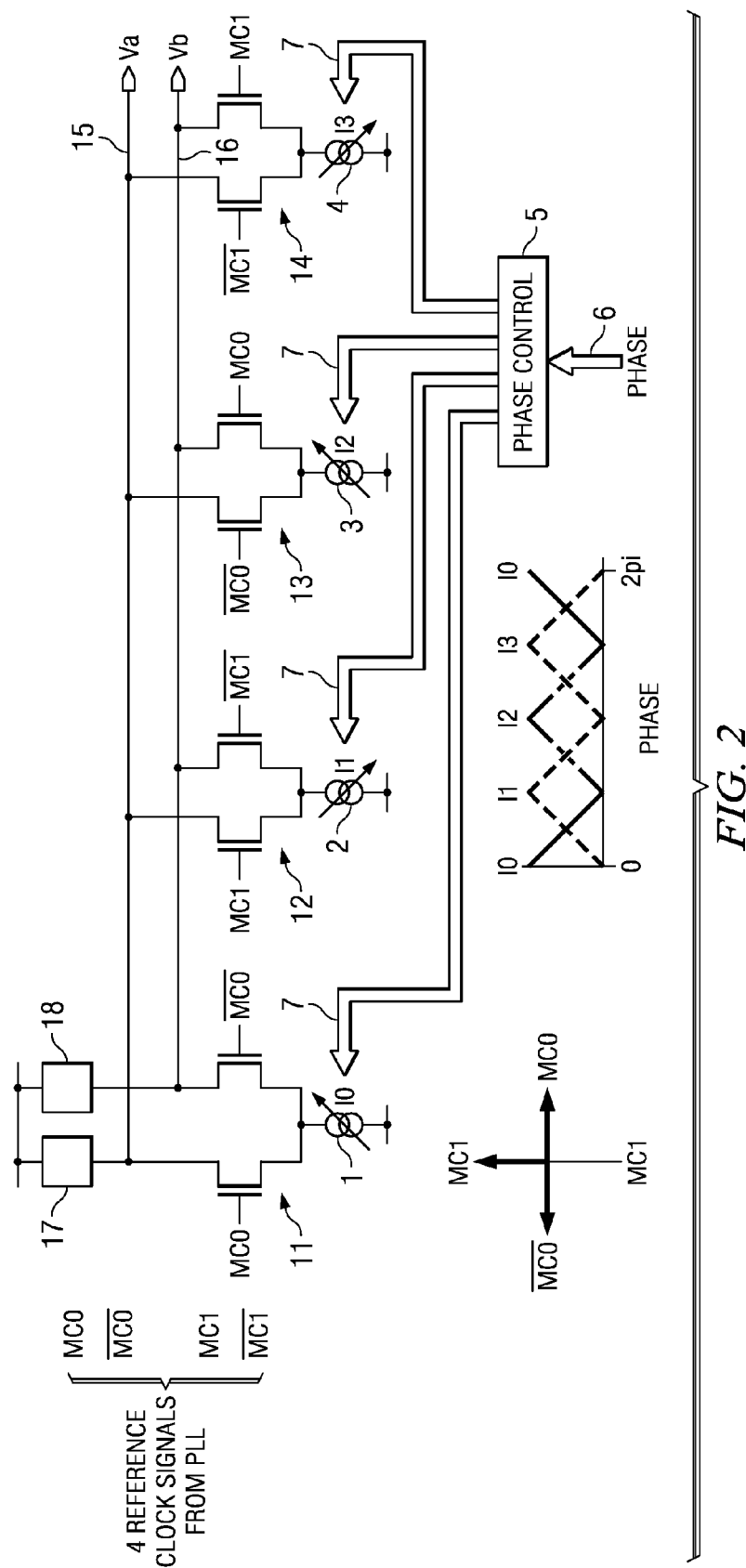
FIG. 2 is a schematic block diagram of a four quadrant phase interpolator of a first embodiment of the present invention.

FIG. 2 is a schematic block diagram of a four quadrant phase interpolator according to a first embodiment of which includes a plurality of clock phase input sections, a plurality of clock phase switching sections, a plurality of current sources, and loads. Here, two differential clocks provide 4 reference clock signals to the clock phase input sections. The reference phases are separated by 90°, and this larger phase spacing gives proportionally greater tolerance of skew than the interpolator of FIG. 1, as well as reduced clock distribution power. Other advantages include: the elimination of input phase multiplexers which prevents the creation of potential switching noise problems; and enabling the use of bleed currents.

In particular each controllable current source unit 1, 2, 3, 4 of the circuit comprises a plurality of switchable current sources in parallel, each of which may be switched on providing a unit current, or off providing no current, in response to a respective bit of a thermometer code. Each switchable current source may, for example be implemented by the circuit shown in the dotted ring in FIG. 1. The thermometer codes 7 are provided by a phase control circuit 5 in response to a phase signal 6. The graph in FIG. 2 shows the currents provided by each of the controllable current source units as a function of phase (and hence also the values the thermometer codes provided by the phase control circuit 5). Note (as shown in the graph) that at any particular phase only two of the current source units providing any substantial current, while the other two are switched off.

Each current source unit 1, 2, 3, 4 drives a respective clock phase switching section 11, 12, 13, 14. Each differential unit comprises two limbs one controlled by a clock signal and the other the complementary signal (e.g. MC0 and MC0\). As marked each clock phase switching section receives a different one of the four phases of the clock signal. The first limbs of the differential units are connected to one 15 of the outputs of the interpolator and the second to the other 16. Each limb comprises a transistor and each clock phase switching section acts to switch current from its controllable current source between two outputs of the interpolator.

Thus at any particular phase the two active current source units and their clock phase switching sections provide their two phases of the clock signal in proportions which when added provide at the output of the interpolator the desired phase.

The interpolator of FIG. 2 has respective loads connected between the outputs 15, 16 and the power supply. These loads may be simple resistive loads, in which case the clock phase switching sections 11, 12, 13, 14 are biased so that they operate as differential amplifiers. As is described below, other arrangements are possible.

As noted above an advantage of this arrangement is that, compared to the circuit of FIG. 1, it eliminates the multiplexers that the select the clock phase to be applied to the switching sections.

While the interpolator circuit of FIG. 2 has been illustrated with four switching sections operating on respective phases (and indeed this is the preferred number). It would be possible to use only three phases but consideration of a phase vector diagram (like that at the bottom left of FIG. 2) will show that the amplitude at some phases would be small. (For three phases—indeed any number of phases all the phases should not be confined to a common interval of phase of 180°.) Any greater number of phases e.g. 5, 6, 8 etc would be possible.

Figure 3:
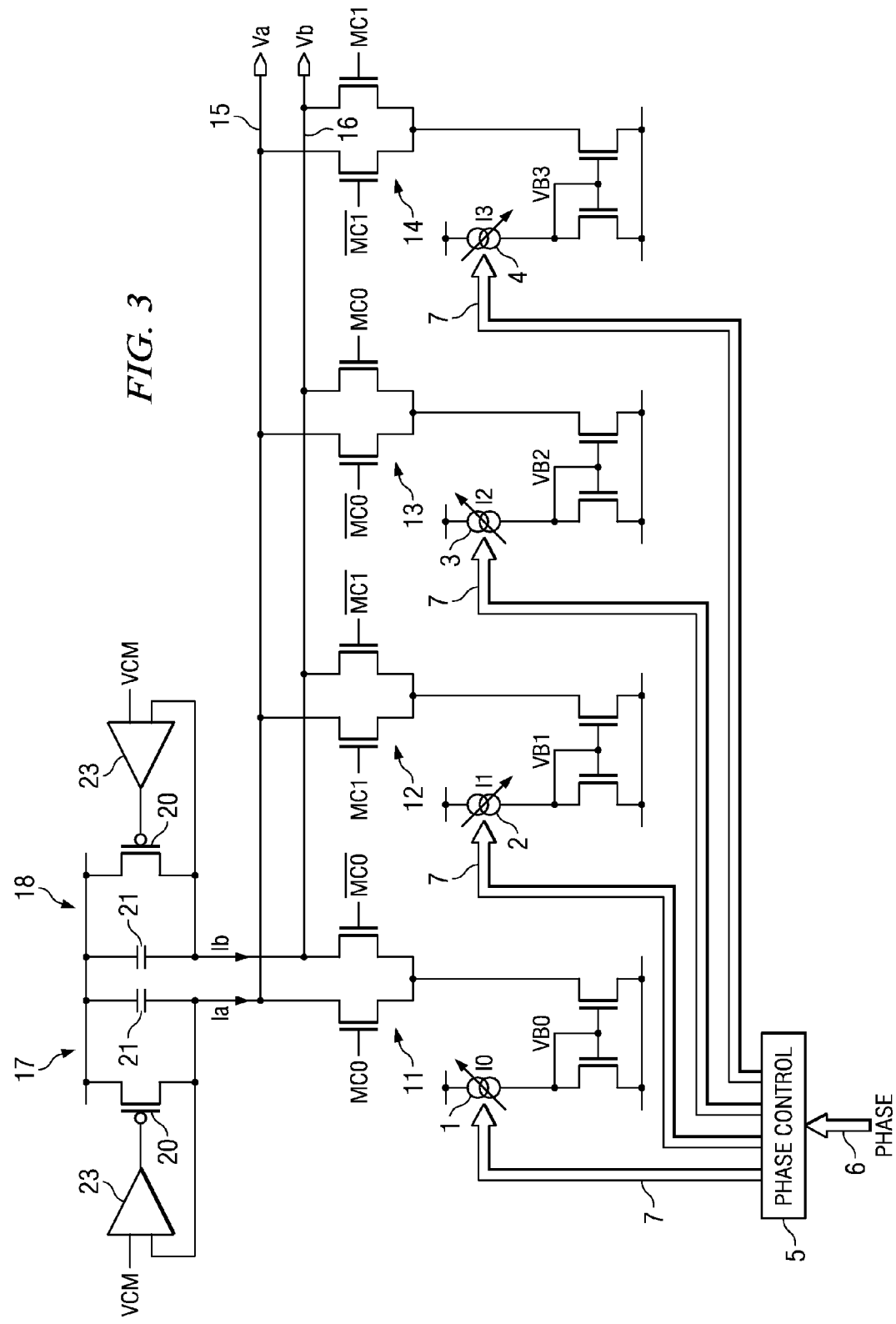
FIG. 3 is a schematic block diagram of a triangulating phase interpolator according to a preferred embodiment of the present invention.

FIG. 3 is a schematic block diagram of a triangulating phase interpolator according to a preferred embodiment which includes a plurality of clock phase input sections, a plurality of clock phase switching sections, a plurality of current sources, and a load. The load may be resistors, transistors and/or any other device to supply a current from a voltage source. Preferably, the current sources are mirrored current sources, as shown in FIG. 3, the use of which improves circuit headroom, provides filtering of noise from current switches and permits the use of a current steering control circuit. For details of suitable mirrored current sources that can be used for generating suitable steering currents to move the operating point of the interpolator around the phase circle, the skilled reader is directed to co-pending patent application filed by the applicant on 12 Jun. 2004, under reference TI-38553, entitled "Improvements In Or Relating to Interpolation", U.S. application Ser. No. 11/150,902.

The clock phase switching sections are enabled based on the phase control signal (not shown). Accordingly, based on the phase control signal each current source is coupled to one of the clock phase switching sections. The magnitude of all the current produced by the current sources may be the same or scaled. This allows the overall amplitude of the interpolated clock signal to be varied, which is useful when the frequency of clock signals is changed (because in this circuit the amplitude is otherwise dependent on frequency).

Note that the number of current sources making up one of the controllable current sources corresponds to the desired granularity between the interpolated clocks available. By utilising 4 current sources, the desired granularity is 4 per quadrant.

The embodiment of FIG. 3 has separate control loops to set common mode voltage in order to counteract the effects of M/S errors.

In detail, the two loads provided in the circuit of FIG. 3 each comprise a capacitor 21 connected between the power supply and the respective output node 15, 16, and a PMOS transistor 20 having its current path connected between the power supply and the respective output node 15, 16. The gate is controlled by an amplifier 23 so that the output node 15, 16 is controlled to have the same voltage as a bias voltage VCM. This it does by comparing the bias voltage VCM with the level on the output node 15, 16. This load acts to integrate the current provided by the current sources 1, 2, 3, 4 via the switching sections 11, 12, 13, 14. Thus the PMOS transistors 20 present a high impedance load on the interpolator output leading, as described below, to a triangulating effect.

Note that in this case the transistors of the switching sections are controlled by their respective complementary clock signals to switch either on or off.

Figure 4A:
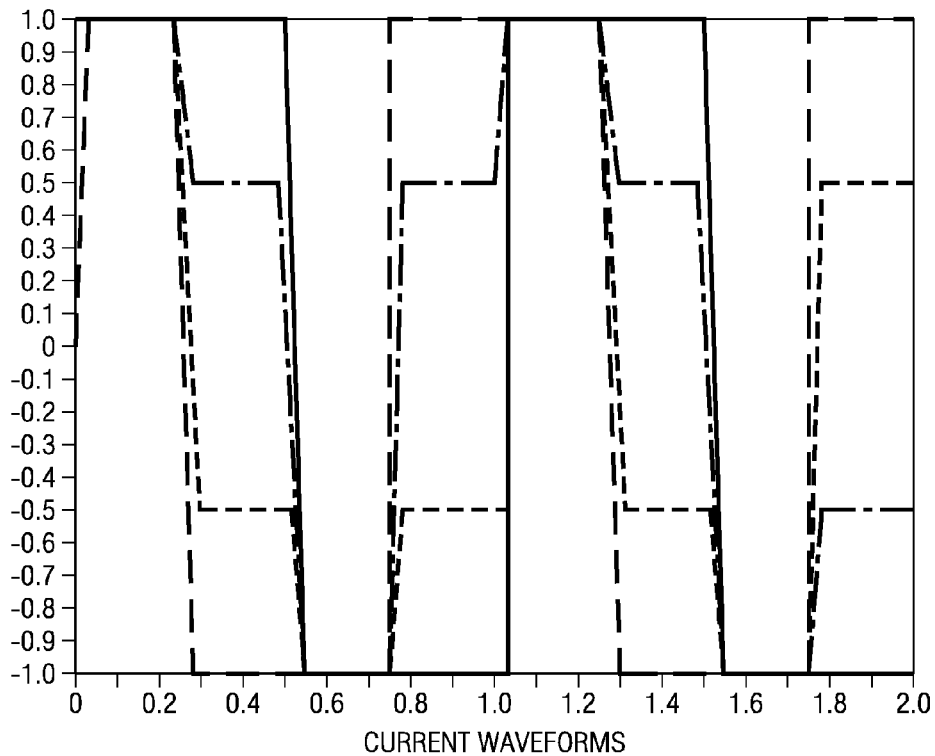
FIG. 4 are graphs of current waveforms and voltage waveforms showing the phase spacing achieved by the triangulating phase interpolator of FIG. 3.
Figure 4B:
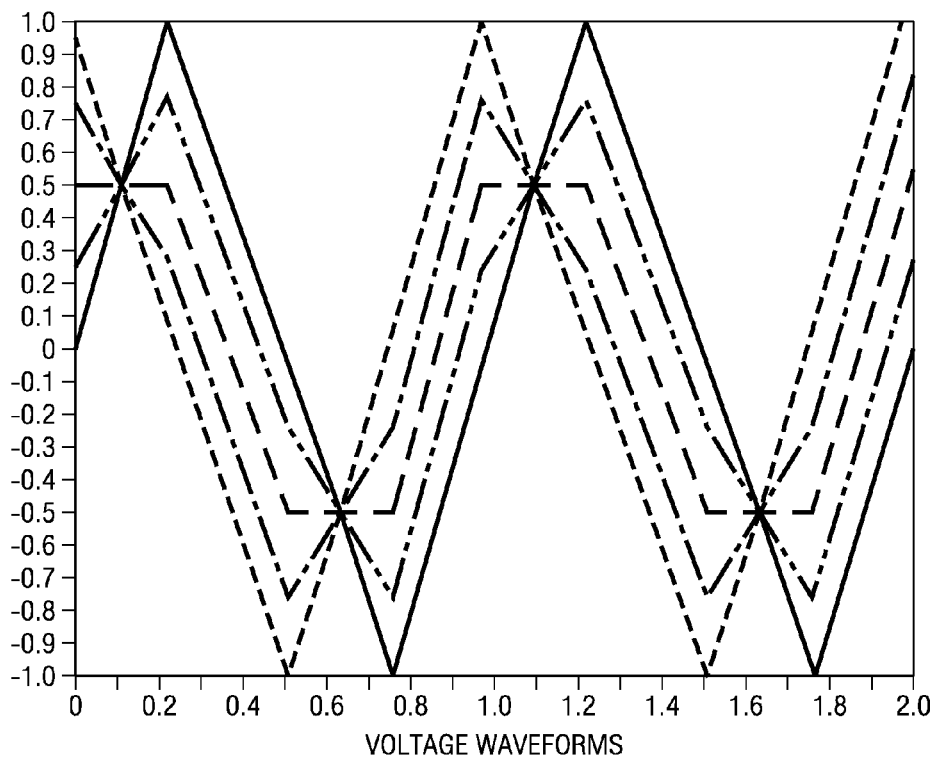

The ideal phase spacing achieved by the phase interpolator illustrated in FIG. 3 is shown by the graphs depicted in FIG. 4. The graphs show the square current waveforms and the triangular voltage waveforms that result from the integration. The phase spacing shown in the graphs corresponds to a theoretically ideal phase step linearity obtained using integrating, or high impedance loads. The use of common-mode control reduces offset-induced level splitting and reduces M/S errors, whilst the high-impedance integrating interpolator load provides good linearity. Other advantages of the phase interpolator design shown in FIG. 3 are that it allows the use of square clocks/limiting differential amplifiers, and it is capable of wide operating frequency range if source currents are proportional to clock frequency.

Note that the integrating loads of FIG. 3 may also be used with the interpolator architecture of FIG. 1.

Figure 5:
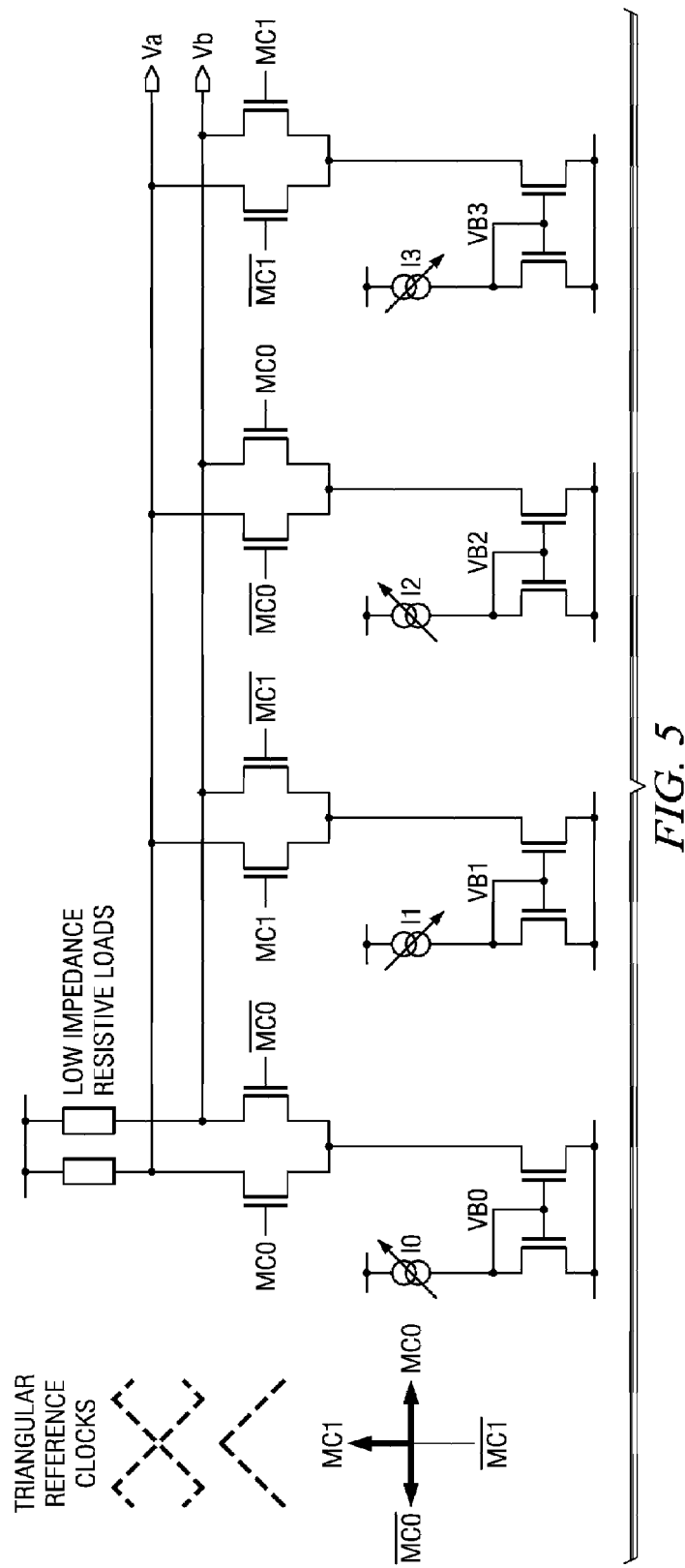
FIG. 5 is a schematic block diagram of a phase interpolator which uses triangular clock input waveforms in accordance with a further embodiment of the invention.

FIG. 5 is a schematic block diagram of a further embodiment of the invention, similar to that of FIG. 3, except that instead of the square reference clock signals used in FIG. 3, triangular reference clocks generated by buffers with integrating load (not shown) are input to the phase interpolator. Furthermore, low impedance loads are used in the interpolator that are impervious to disruption, the high-impedance nodes in the triangulation buffers are not subject to disruption, and the triangulation buffers provide effective M/S correction.

While the invention has been shown and described with reference to preferred embodiments thereof, it is well understood by those skilled in the art that various changes and modifications can be made in the invention without departing from the spirit and scope of the invention as defined by the appended claims.

The invention claimed is:

1. A clock phase interpolator comprising:
   a pair of output nodes
   a plurality of complementary clock signal inputs;
   an equal plurality of current sources;
   an equal plurality of clock switching sections coupled to the current sources;
   two loads connected between a power supply and a respective one of the output nodes, each load comprising an integrator having a capacitance in parallel with a high impedance transistor current source pull-up and common-mode control loop to regulate the output voltage;
   wherein each clock switching section is coupled to the output nodes and connected to switch, under the control of a complementary clock signal on a respective one of the complementary clock signal inputs, current provided by a respective one of the current sources between the two output nodes, and
   wherein the current sources are controllable to provide interpolation between the complementary clock signals on the complementary clock signal inputs.

2. A clock phase interpolator comprising:
   a pair of output nodes
   a plurality of complementary clock signal inputs;
   an equal plurality of current sources;
   an equal plurality of clock switching sections coupled to the current sources;
   two loads connected between a power supply and a respective one of the output nodes, each load comprising an integrator;
   wherein each clock switching section is coupled to the output nodes and connected to switch, under the control of a complementary clock signal on a respective one of the complementary clock signal inputs, current provided by a respective one of the current sources between the two output nodes, and wherein the current sources are controllable to provide interpolation between the complementary clock signals on the complementary clock signal inputs wherein the interpolator has exactly four clock switching sections and wherein each load comprises:
   a capacitor connected between a power supply and the respective output node,
   a PMOS transistor having its current path connected between the power supply and the respective output node, and
   an amplifier,
   wherein the gate of the PMOS transistor is controlled by the amplifier so that the output node is controlled to have the same voltage as a bias voltage.

3. A clock phase interpolator according to claim 1, wherein the current sources each comprise, a set of current sources connected in parallel to provide a control current, which may be turned off and on depending on the desired interpolation phase and a current mirror connected to receive the control current as its input and to mirror that current to the respective clock switching section.

4. A clock phase interpolator according to claim 1, wherein the current sources each comprise, a set of current sources connected in parallel to provide a control current, which may be turned off and on depending on the desired interpolation phase and a current mirror connected to receive the control current as its input and to mirror that current to the respective clock switching section.

5. A clock phase interpolator according to claim 2 wherein the switching sections are differential amplifiers.

6. A clock phase interpolator comprising:
a pair of output nodes,
a plurality of complementary clock signal inputs, the number of the plurality being at least three,
an equal plurality of current sources,
an equal plurality of clock switching sections,
two loads connected between a power supply and a respective on of the output nodes, A clock phase interpolator according to claim 4 wherein each load comprises:
 a capacitor connected between a power supply and the respective output node,
 a PMOS transistor having its current path connected between the power supply and the respective output node, and
 an amplifier,
wherein the gate of the PMOS transistor is controlled by the amplifier so that the output node is controlled to have the same voltage as a bias voltage, wherein each clock switching section is connected to switch, under the control of a complementary clock signal on a respective one of the complementary clock signal inputs, the current provided by a respective one of the current sources between the two output nodes, and wherein the current sources are controllable to provide interpolation between signals on the complementary clock signal inputs.

7. A clock phase interpolator comprising:
a pair of output nodes,
plurality of complementary clock signal inputs, the number of the plurality being two,
an equal plurality of current sources,
an equal plurality of clock switching sections,
wherein each clock switching section is connected to switch, under the control of a complementary clock signal on a respective one of the complementary clock signal inputs, the current provided by a respective one of the current sources between the two output nodes,
wherein the current sources are controllable to provide interpolation between signals on the complementary clock signal inputs, and
wherein each load comprises an integrator comprising a capacitor connected between a power supply and the respective output node,
a PMOS transistor having its current path connected between the power supply and the respective output node, and an amplifier,
wherein the gate of the PMOS transistor is controlled by the amplifier so that the output node is controlled to have the same voltage as a bias voltage.

* * * * *